(12) United States Patent
Kohda et al.

(10) Patent No.: US 6,768,407 B2
(45) Date of Patent: Jul. 27, 2004

(54) MAGNETIC FIELD GENERATOR

(75) Inventors: Tsutomu Kohda, Takatsuki (JP);
Masayuki Kumada, Tsukuba (JP)

(73) Assignees: Sumitomo Special Metals Co., Ltd.,
Osaka (JP); **National Institute of
Radiological Sciences**, Chiba (JP)

( * ) Notice: Subject to any disclaimer, the term of this patent is extended or adjusted under 35 U.S.C. 154(b) by 0 days.

(21) Appl. No.: 10/471,295

(22) PCT Filed: Mar. 22, 2002

(86) PCT No.: PCT/JP00/02804

§ 371 (c)(1),
(2), (4) Date: Jan. 9, 2004

(87) PCT Pub. No.: WO02/078018

PCT Pub. Date: Oct. 3, 2002

(65) Prior Publication Data

US 2004/0104794 A1 Jun. 3, 2004

(30) Foreign Application Priority Data

Mar. 23, 2001 (JP) .......................... 2001-86098

(51) Int. Cl.[7] ................................ H01F 7/02
(52) U.S. Cl. ...................................... 335/306
(58) Field of Search ................. 335/296–306

(56) References Cited

U.S. PATENT DOCUMENTS 4,953,555 A * 9/1990 Leupold et al. ............. 600/421

FOREIGN PATENT DOCUMENTS

| JP | 9-90009 | 4/1997 |
|---|---|---|
| JP | 2000-243621 | 9/2000 |
| JP | 2000-357608 | 12/2000 |
| JP | 2001-68763 | 3/2001 |

* cited by examiner

*Primary Examiner*—Ramon M. Barrera
(74) *Attorney, Agent, or Firm*—Armstrong, Kratz, Quintos, Hanson & Brooks, LLP.

(57) ABSTRACT

A permanent-magnet-type magnetic field generator (10) capable of generating a strong magnetic field not weaker than 3 T in a magnetic field generation space (12) is provided. The magnetic field generator (10) has an axially central portion serving as the magnetic field generation space (12), and includes a first magnetic circuit (14) provided by a Halbach array at an outer central portion, and a second magnetic circuit (16) formed inside the first magnetic circuit (14) to surround the magnetic field generation space (12). The first magnetic circuit (14) is provided by permanent magnets (20*a*)–(20*f*) and central portions (A) of permanent magnets (22*a*)–(22*f*). The second magnetic circuit (16) is provided by a pair of pole pieces (24*a*) and (24*b*) each having a saturation magnetism not smaller than 1.6 T, and central portions (B) of permanent magnets (26*a*)–(26*d*) which provides magnetic interconnection between the pole pieces (24*a*) and (24*b*).

4 Claims, 7 Drawing Sheets

(a)

(b)

(c)

MAGNETIC FIELD GENERATOR

TECHNICAL FIELD

The present invention relates to a magnetic field generator, and more specifically to a permanent-magnet-type magnetic field generator to be used for bending magnets, particle accelerators, magnetic resonance imaging apparatuses, cancer treatment apparatuses, cancer diagnosing apparatuses, chemical element analyzers, and so on.

BACKGROUND ART

Conventionally, for generation of a strong magnetic field by using permanent magnets, proposals are made for a magnetic circuit using a Halbach array, such as one disclosed in the Japanese Patent Laid-Open No. 2000-243621, in which generally triangular permanent magnets are disposed annularly.

With such a magnetic circuit, there was a belief that it is difficult to obtain a magnetic field intensity greater than an intrinsic coercive force of the permanent magnets, in its magnetic field generation space. Also, the permanent magnets normally used have an intrinsic coercive force of approximately 2700 kA/m, and therefore it has been difficult for the permanent-magnet-type magnetic circuit to achieve a magnetic field intensity not lower than 3 T in the magnetic field generation space.

In recent years, a strong magnetic field not weaker than 3 T is in demand for use in particle accelerators and other apparatuses, and the demand is currently met by superconductive electromagnets. However, these systems call for liquefied helium and a freezer therefore, leading to problems such as complexity in operation and increase in running cost.

It is therefore a primary object of the present invention to provide a permanent-magnet-type magnetic field generator capable of generating a strong magnetic field not weaker than 3 T in the magnetic field generation space.

DISCLOSURE OF THE INVENTION

According to an aspect of the present invention, there is provided a magnetic field generator comprising: a first magnetic circuit including first permanent magnets disposed annularly; and a second magnetic circuit including a pair of pole pieces provided inside the first magnetic circuit, and second permanent magnets for magnetic connection of the pole pieces, wherein the pole pieces are opposed to each other for formation of a magnetic field generation space, each of the pole pieces having a saturation magnetism not smaller than 1.6 T.

According to this invention, the magnetic flux generated by the first magnetic circuit can be further concentrated between the pair of pole pieces by the second magnetic circuit, and therefore it becomes possible to generate a strong magnetic field far beyond the intrinsic coercive force of the permanent magnets, or more specifically a magnetic field of not weaker than 3 T, in the magnetic field generation space. Further, use of permanent magnets in place of electromagnets enables to reduce running cost.

Preferably, a direction of magnetization of each second permanent magnet is not a 180-degree angle with respect to a direction of magnetic field of the magnetic field generation space. In this case, the direction of magnetization of the second permanent magnet is not truly away from the direction of magnetic field of the magnetic field generation space. Therefore, a demagnetizing field affecting the second permanent magnet is small, and the second permanent magnets are less prone to demagnetization by the magnetic field in the magnetic field generation space. This results in generation of a strong magnetic field in the magnetic field generation space.

Further, preferably, the second permanent magnets have a greater coercive force than the first permanent magnets. In this case, the second permanent magnets are less prone to demagnetization by the magnetic field of the magnetic field generation space. Therefore, there is even less demagnetization of the second permanent magnets, enabling to generate a strong magnetic field in the magnetic field generation space.

Further, preferably, the magnetic field generator further comprises third permanent magnets disposed on both end sides of the first permanent magnets. By providing the third permanent magnets on each end side of the first permanent magnets thereby sandwiching the first permanent magnets with the third permanent magnets, it becomes possible to decrease leakage flux. Therefore, it becomes possible to generate a strong magnetic field in the magnetic field generation space and to prevent formation of a strong magnetic field outside the magnetic field generator.

BEST MODE FOR CARRYING OUT THE INVENTION

Hereinafter, an embodiment of the present invention will be described with reference to the drawings.

Figure 1:
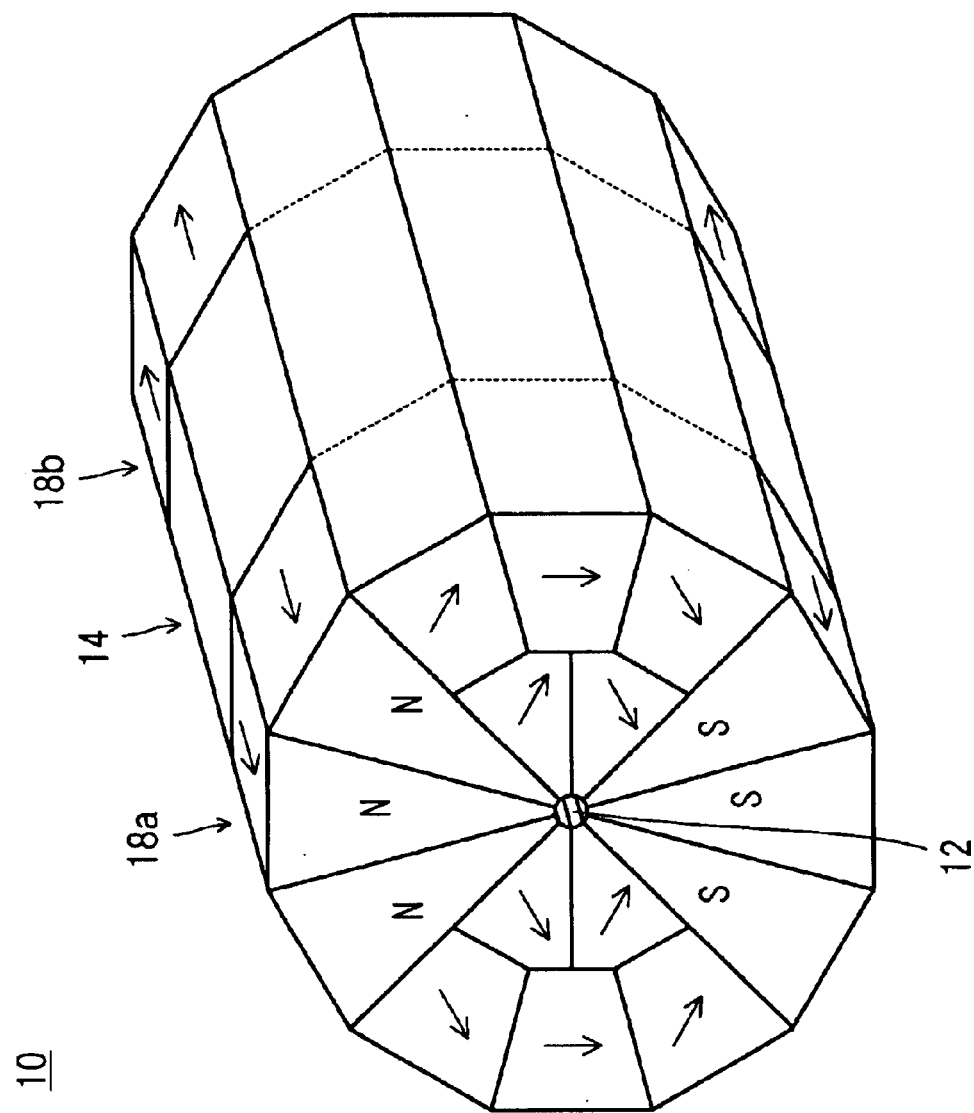
FIG. 1 is a perspective view showing an embodiment of the present invention.
Figure 2:
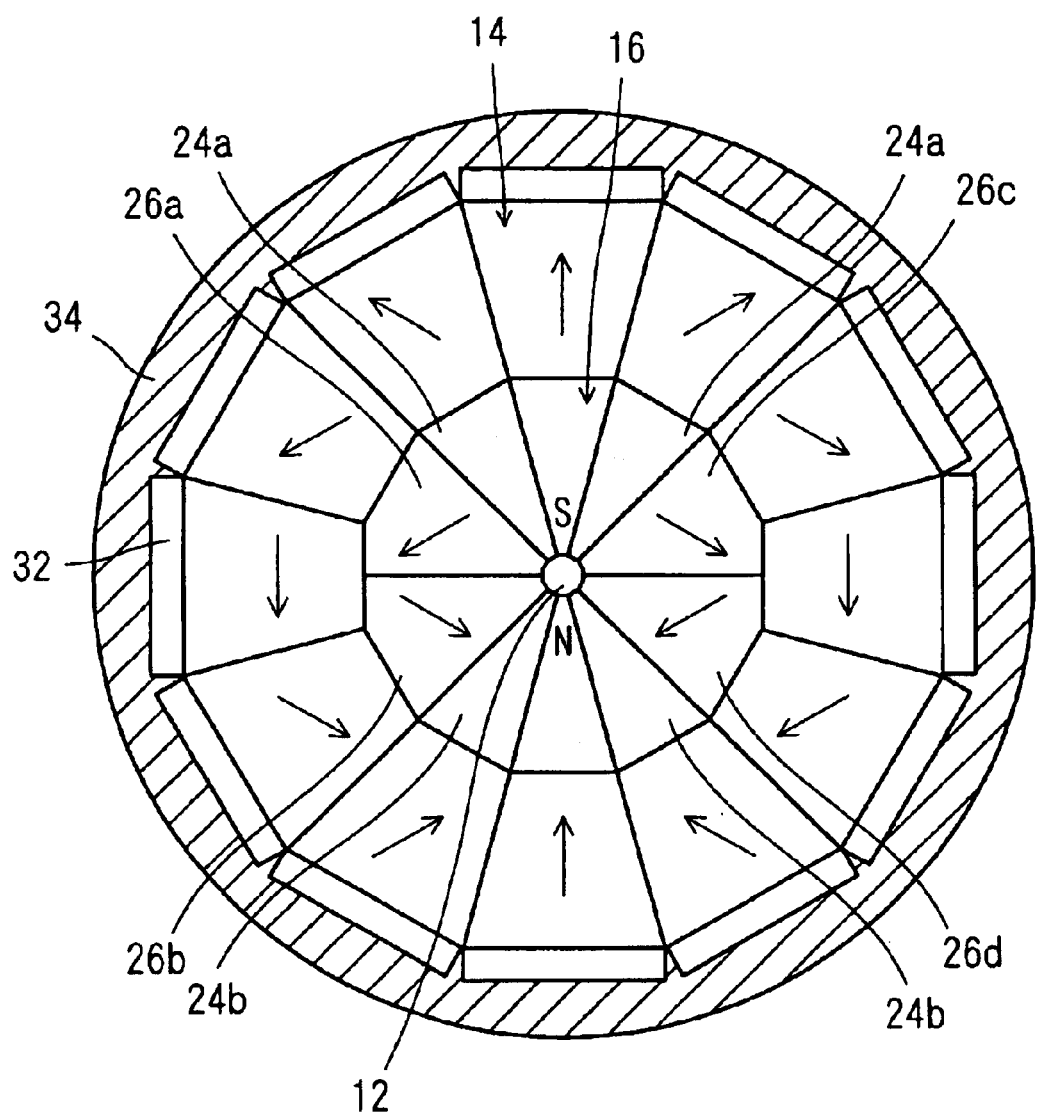
FIG. 2 is a sectional diagram showing a first magnetic circuit and a second magnetic circuit in the embodiment in FIG. 1.
Figure 2:
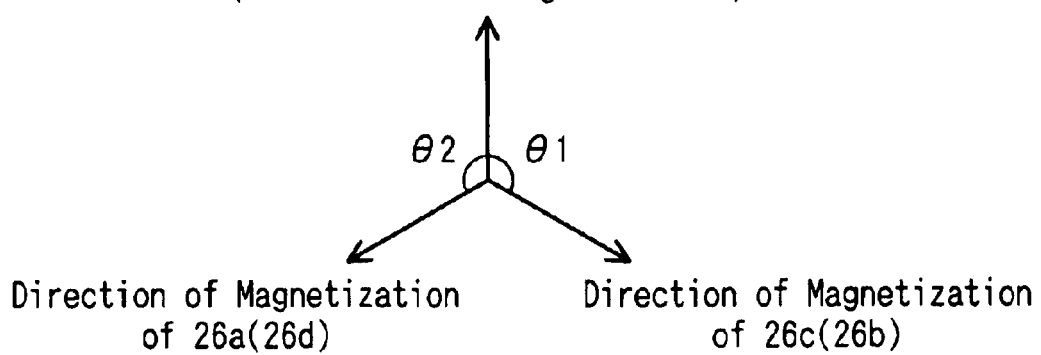

Referring to FIG. 1 and FIG. 2, a magnetic field generator 10 according to an embodiment of the present invention is formed into a dodecagonally cylindrical shape, and has a generally tubular (dodecagonally cylindrical) magnetic field generation space 12 at a longitudinally central portion.

The magnetic field generator 10 includes a first magnetic circuit 14 provided by a Halbach array at an outer central portion, a second magnetic circuit 16 formed inside of the first magnetic circuit 14 to surround the magnetic field generation space 12, and the third magnetic circuits 18a and 18b each formed at an outer end portion.

Figure 3:
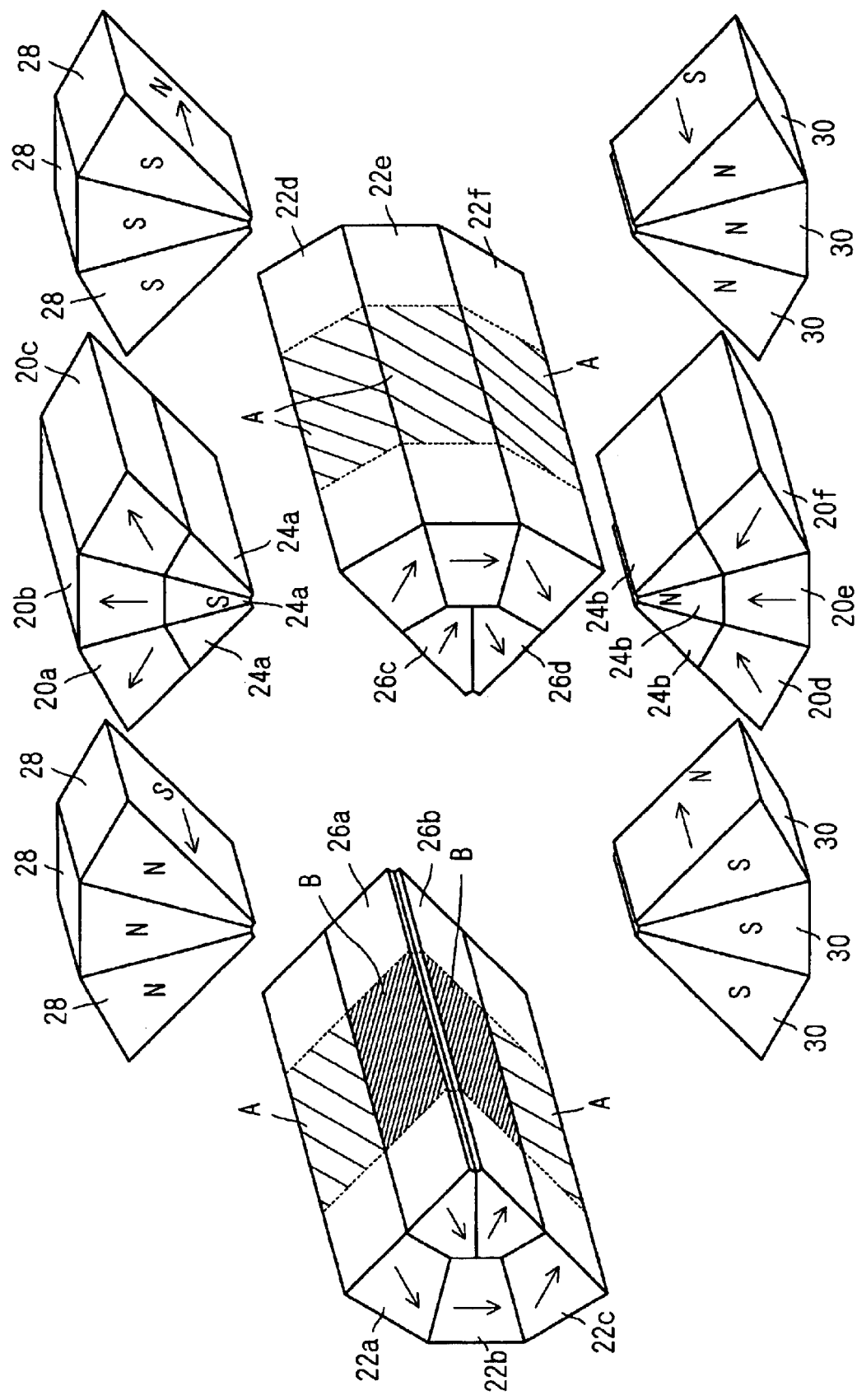
FIG. 3 is an exploded perspective view of the embodiment in FIG. 1.
Figure 4:
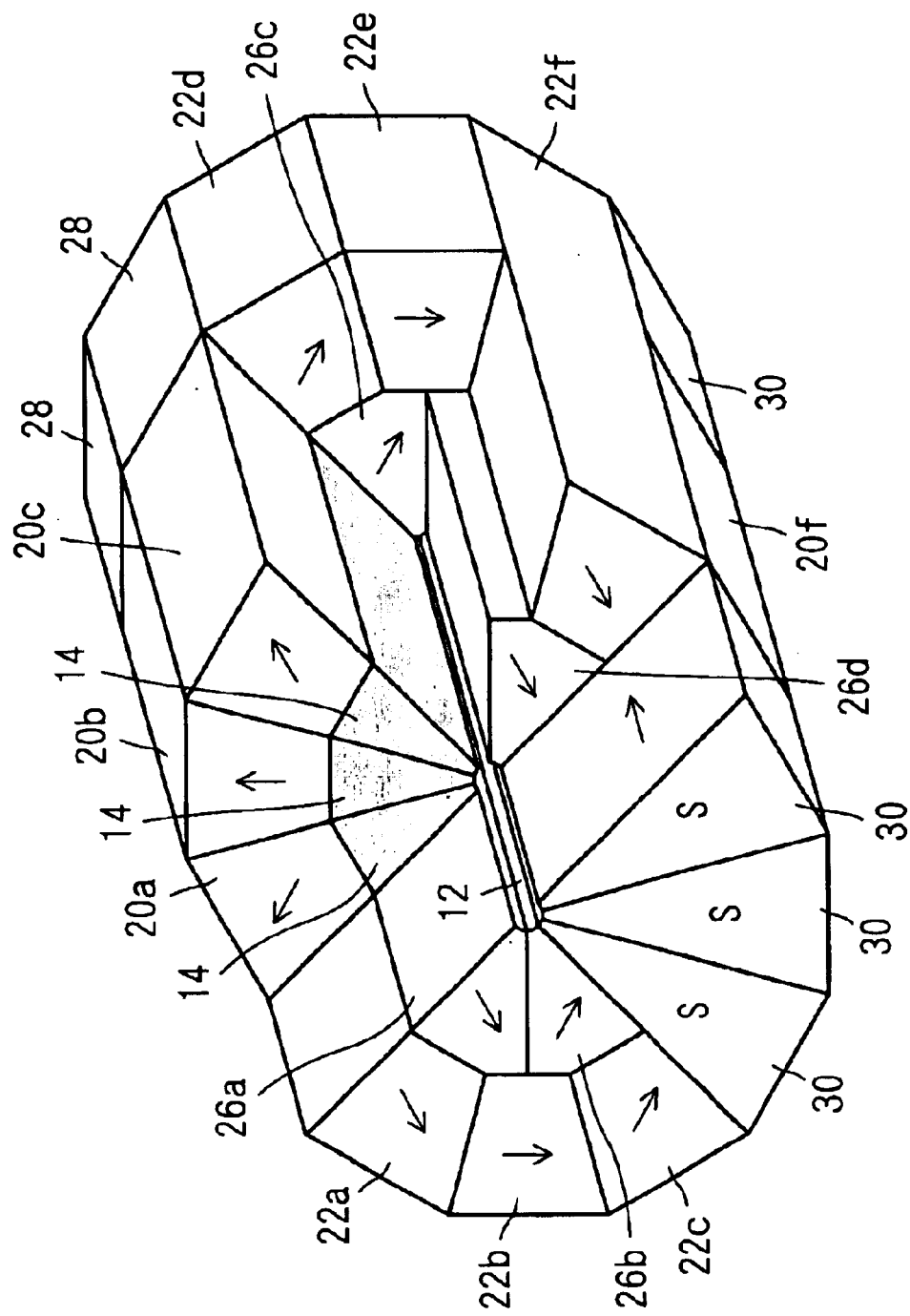
FIG. 4 is a diagram showing an internal construction of the embodiment in FIG. 1.

Referring to FIG. 3 and FIG. 4, the magnetic field generator 10 includes permanent magnets 20a–20f and 22a–22f each having a shape of an obelisk. Each of the permanent magnets 20a–20c has an inward orienting face provided with an S-pole pole piece 24a which is made of Permendule and has a shape of generally triangular column. Each of the permanent magnets 20d–20f has an inward orienting face provided with an N-pole pole piece 24b which is made of Permendule and has a generally triangular column. The pole pieces 24a and 24b gather the generated magnetic flux in the magnetic field generation space 12. The permanent magnets 22a–22f have inward orienting faces provided with permanent magnets 26a–26d each having a shape of generally rectangular column. The permanent magnets 26a–26d magnetically interconnect the pole pieces 24a and 24b. The pole pieces 24a and 24b each have a saturation magnetism not smaller than 1.6 T.

Further, each of the permanent magnets 20a–20c to which the pole piece 24a is fixed has two ends each provided with a permanent magnet 28 magnetized longitudinally outward of the magnetic field generation space 12. On the other hand, each of the permanent magnets 20d–20f to which the pole piece 24b is fixed has two ends each provided with a permanent magnet 30 magnetized longitudinally inward of the magnetic field generation space 12. The permanent magnets 20a–20f have the same dimensions, and the permanent magnets 22a–22f have the same dimensions. The permanent magnets 22a–22f are longer than the permanent magnets 20a–20f; the permanent magnets 22a–22f have central portions A indicated by hatching in the drawing, which serve correspondingly to the permanent magnets 20a–20f. With this arrangement, when the permanent magnets 20a–20f have their respective ends mounted with the permanent magnets 28 or 30, the assembly has the same overall length as the permanent magnets 22a–22f.

Therefore, the permanent magnets 20a–20f and the hatched central portions A of the permanent magnets 22a–22f form the annular first magnetic circuit 14. Further, a total of six pole pieces 24a and 24b, together with the hatched central portions B of the permanent magnets 26a–26d (not illustrated for the permanent magnets 26c and 26d), form the second magnetic circuit 16. Still further, the permanent magnets 28 and 30 provided on one end of the permanent magnets 20a–20f, end portions of the permanent magnets 22a–22f and end portions of the permanent magnets 26a–26d form the third magnetic circuit 18a. Likewise, the permanent magnets 28 and 30 provided on the other end of the permanent magnets 20a–20f, the other end portions of the permanent magnets 22a–22f and the other end portions of the permanent magnets 26a–26d form the third magnetic circuit 18b.

The permanent magnets 26a–26d used in the second magnetic circuit 16 preferably have a greater coercive force than the permanent magnets 20a–20f and 22a–22f used in the first magnetic circuit 14. For example, the permanent magnets 20a–20f and 22a–22f are provided by a permanent magnet material having a coercive force not smaller than 1273 kA/m, such as NEOMAX-44H manufactured by Sumitomo Special Metals Co., Ltd., whereas the permanent magnets 26a–26d are provided by a permanent magnet material having a coercive force not smaller than 2387 kA/m, such as NEOMAX-32EH manufactured by the same company. Preferably, the coercive force of the permanent magnets 26a–26d is not smaller than 1.2 times the coercive force of the permanent magnets 20a–20f and of the permanent magnets 22a–22f, and more preferably, not smaller than 1.4 times.

As in the above, if the coercive force of the permanent magnets 26a–26d is greater than the coercive force of the permanent magnets 20a–20f and of the permanent magnets 22a–22f, the permanent magnets 26a–26d are not very much affected by the magnetic field generated in the magnetic field generation space 12, enabling to further decrease demagnetization in the permanent magnets 26a–26d and to generate a strong magnetic field in the magnetic field generation space 12.

Note that FIG. 3 is an exploded perspective view to facilitate understanding of the magnetic field generator 10, and does not show a sequence for assembling the members together.

Note also that arrows in FIG. 1 through FIG. 4 show directions of magnetization in the permanent magnets.

Figure 5:
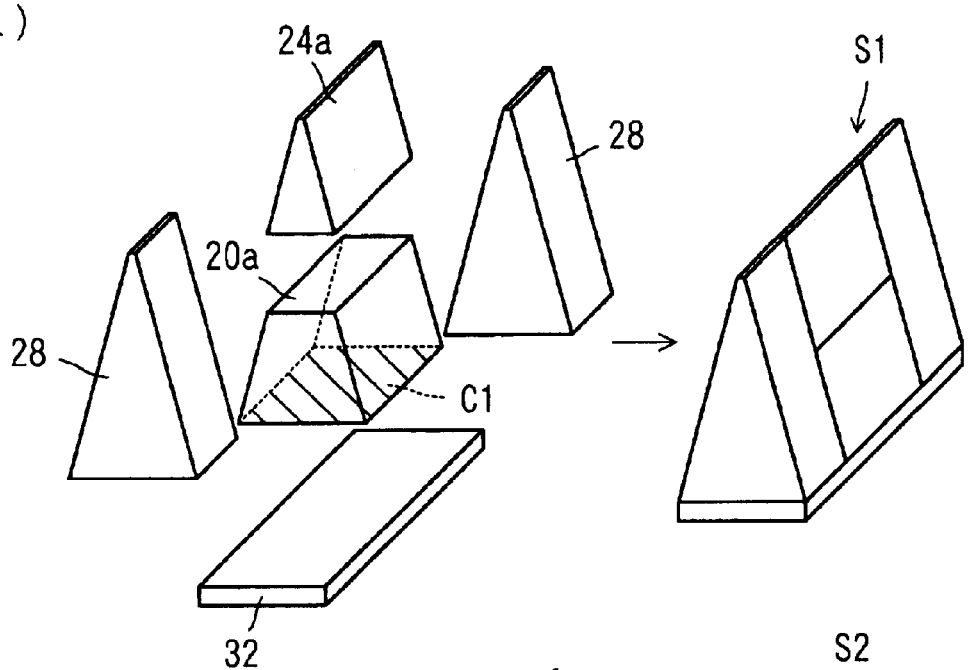
FIG. 5 is a perspective view of segments and other components used in the embodiment in FIG. 1.
Figure 5:
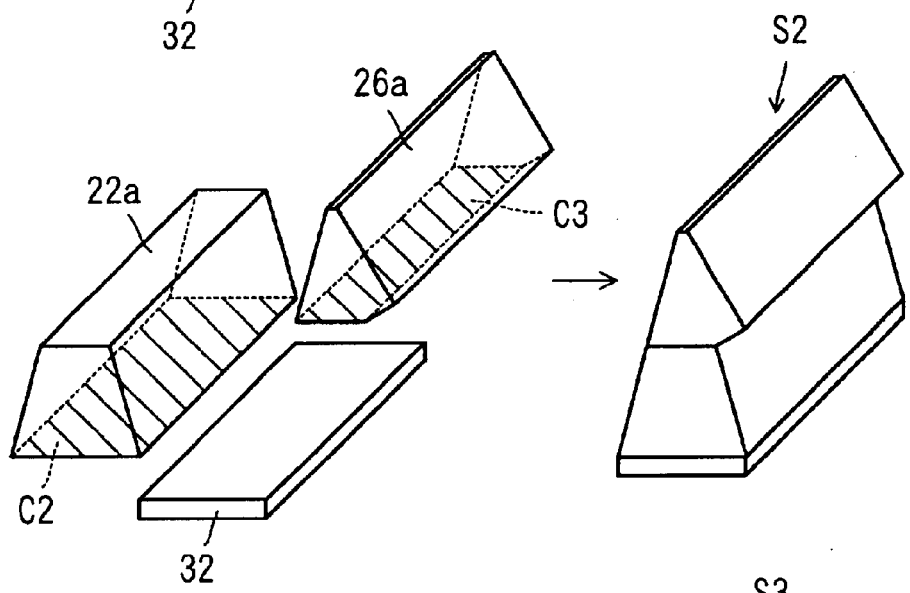
Figure 5:
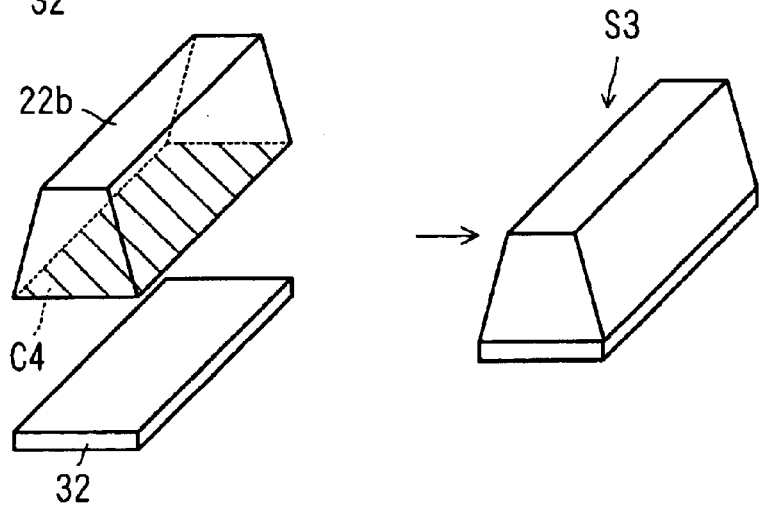

The direction of magnetization of the permanent magnet 20a is at a 60 degree-angle to a bottom surface C1 shown hatched in FIG. 5(a). Likewise, the direction of magnetization of the permanent magnets 20c, 20d and 20f is at a 60 degree-angle to their respective bottom surfaces, whereas the permanent magnets 20b and 20e are magnetized at a 90 degree-angle. The direction of magnetization of the permanent magnet 22a is at a 30 degree-angle to a bottom surface C2 shown hatched in FIG. 5(b). Likewise, the direction of magnetization of the permanent magnets 22c, 22d and 22f is at a 30 degree-angle to their respective bottom surfaces. The direction of magnetization of the permanent magnet 26a is at a 30 degree-angle to a bottom surface C3 shown hatched in FIG. 5(b). Likewise,,the direction of magnetization of the permanent magnets 26b–26d is at a 30 degree-angle to their respective bottom surfaces. Further, the permanent magnet 22b is magnetized in parallel to a bottom surface C4 shown hatched in FIG. 5(c). Likewise, the permanent magnet 22e is magnetized in parallel to its bottom surface. It should be noted here that these directions of magnetization of the permanent magnets are given only as examples, and are not limited to these.

With these members, the magnetic field generator 10 can be assembled as follows for example:

First, referring to FIG. 5(a), the pole piece 24a is bonded to the permanent magnet 20a to make a generally triangular column. To each end of this assembly, the permanent magnet 28 is bonded, and to the bottom C1, a nonmagnetic stainless-steel base 32 for example is attached, to obtain a segment S1. The same steps are followed for the permanent magnets 20b–20f, to make more of the segments S1.

Next, referring to FIG. 5(b), the permanent magnet 26a is bonded to the permanent magnet 22a, and a stainless-steel base 32 is attached to the bottom surface C2 of the permanent magnet 22a, to obtain a segment S2. Likewise, the permanent magnets 22c and 26b are integrated with a stainless-steel base 32, to be another of the segment S2. Further, referring to FIG. 5(c), a stainless-steel base 32 is attached to the bottom surface C4 of the permanent magnet 22b, to obtain a segment S3. Then, the segment S3 is sandwiched between and integrated with the two segments S2.

Following the same steps, each of the permanent magnets 22d and 22f is assembled into a segment S2, the permanent magnet 22e is assembled into a segment S3, and the obtained segment S3 is sandwiched between and integrated with the two segments S2.

The assemblies thus obtained are further bonded together to be the magnetic field generator 10.

The magnetic field generator 10 is fitted into a holder 34, which is nonmagnetic for example, such as shown in FIG. 2, whereby the constituent members of the magnetic field generator 10 are prohibited from popping out.

As understood from FIG. 2, in the first magnetic circuit 14 of the magnetic field generator 10 thus assembled, a closed magnetic field is formed along the directions of magnetization of the permanent magnets 20a–20f and 22a–22f. In the second magnetic circuit 16, a closed magnetic field is formed along the permanent magnets 26a–26d. In this construction, the pole piece 24a next to the magnet member 26a is magnetized in the same direction as the magnet member 26a. Likewise, the pole piece 24a next to the magnet member 26c is magnetized in the same direction as the magnet member 26c, the pole piece 24b next to the magnet member 26b is magnetized in the same direction as the magnet member 26b, and the pole piece 24b next to the magnet member 26d is magnetized in the same direction as the magnet member 26d. The term "the same direction" used herein, however, should not be understood as limiting to an exactly identical direction, but should be understood as a direction not opposing to the direction of closed magnetic field provided by the second magnetic circuit 16.

According to the magnetic field generator 10, a magnetic flux generated by the first magnetic circuit 14 is further concentrated between the pair of pole pieces 24a and 24b by the second magnetic circuit 16. Therefore, it becomes possible for a compact apparatus to generate a strong magnetic field greater than an intrinsic coercive force of the permanent magnets, or more specifically a magnetic field not weaker than 3 T, in the magnetic field generation space 12. Further, the use of permanent magnets instead of electromagnets enables to cut down on running cost. Further, the pole pieces 24a and 24b each have a shape of a wedge oriented inward radially of the cylinder. Since the wedge has an increasing volume outward radially of the magnetic circuit, magnetic flux do not saturate in an outer region of the magnetic circuit. Therefore, it is possible to concentrate more magnetic flux between the pole pieces 24a and 24b.

By providing the permanent magnets 28 at each longitudinal end of the permanent magnets 20a–20c and the permanent magnets 30 at each longitudinal end of the permanent magnets 20d–20f, it becomes possible to decrease leakage flux, and therefore to generate a strong magnetic field in the magnetic field generation space 12 while preventing a generation of a strong magnetic field outside the magnetic field generation space 12.

Figure 6:
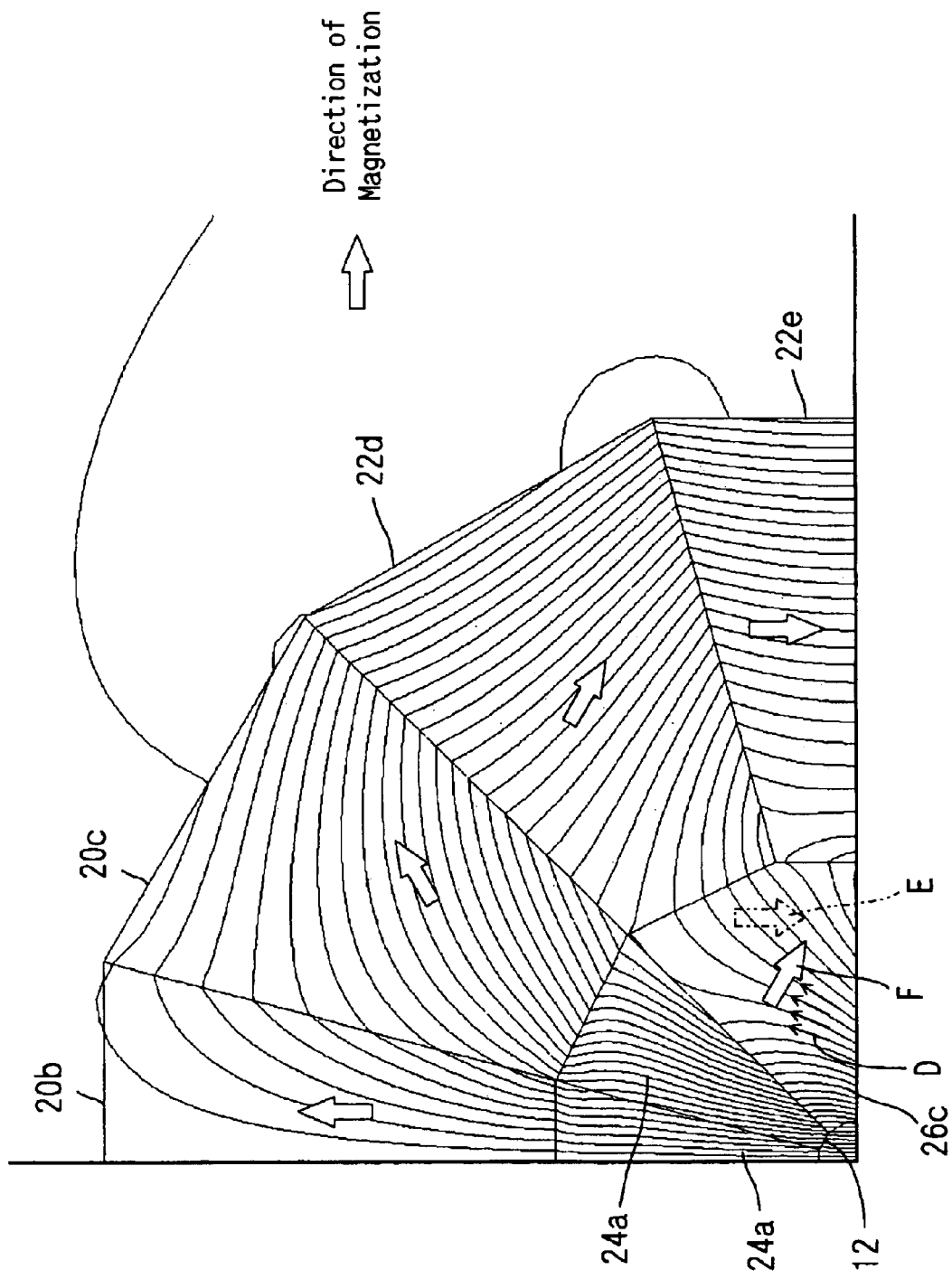
FIG. 6 is a magnetic flux distribution diagram in the embodiment in FIG. 1.

FIG. 6 shows a result of a magnetic field analysis of an upper right half (See FIG. 2) of the magnetic field generator 10. White arrows in FIG. 6 show directions of magnetization.

Referring to FIG. 6, in the permanent magnet 26c which is next to the S-pole pole piece 24a, a magnetic flux flows in an upper right direction as indicated by four arrows D. In designing the second magnetic circuit 16, it is necessary that the magnetic flux flowing through the pole piece 24a is allowed to return efficiently to the other pole piece 24b opposing on the other side of the magnetic field generation space 12. However, if the direction of magnetization of the permanent magnet 26c is in a direction indicated by an arrow E drawn in long dashed two short-dashed lines or vertically downwardly as in the figure (i.e. if the direction of the magnetic field in the magnetic field generation space is at a 180 degree-angle to the direction of magnetization of the second permanent magnet) then, the permanent magnet 26c will be demagnetized by the strong magnetic flux indicated by the arrows D.

For this reason, the direction of magnetization of the permanent magnet 26c was selected to be outwardly of the second magnetic circuit 16 as indicated by an arrow F, whereby the demagnetizing field affecting the direction of magnetization of the permanent magnet 26c was decreased and demagnetization of the permanent magnet 26c was decreased. As shown in FIG. 2, the direction of magnetization of the permanent magnet 26a was also selected to be outwardly of the second magnetic circuit 16. Further, the direction of magnetization for each of the permanent magnets 26b and 26d flanking on the N-pole pole pieces 24b was selected to be inwardly of the second magnetic circuit 16, whereby demagnetization of the permanent magnets 26b and 26d was decreased. In other words, directions of magnetization of the second permanent magnets were selected not to be a 180 degree-angle to the direction of the magnetic field of the magnetic filed generation space, whereby demagnetization of the second permanent magnets was reduced.

When the magnetic field intensity is intended to be not smaller than 2.5 T and not greater than 5.0 T, and the permanent magnets 26a–26d are provided by sintered neodymium magnets, in order to generate a stronger magnetic field while reducing demagnetization of the permanent magnets 26a–26d, as shown in FIG. 2, it is preferable that the angles $\theta 1$ and $\theta 2$ made by the direction of the magnetic field (orientation of magnetic flux) in the magnetic field generation space 12 with respect to the directions of magnetization of the permanent magnets 26a–26d are not smaller than 90 degrees and not greater than 150 degrees. More preferably, the angles are not smaller than 105 degrees and not greater than 135 degrees.

With this arrangement, it becomes possible to reduce demagnetization of the permanent magnets 26a–26d by the magnetic field generated between the pair of pole pieces 24a and 24b. Further, since the direction of magnetization for each of the permanent magnets 26a–26d is not truly away from the direction of magnetic field in the magnetic field generation space 12, demagnetizing fields affecting the permanent magnets 26a–26d are small, and the permanent magnets 26a–26d become less prone to demagnetization by the magnetic field in the magnetic field generation space 12. Therefore, it becomes possible to generate a strong magnetic field in the magnetic field generation space 12.

Figure 7:
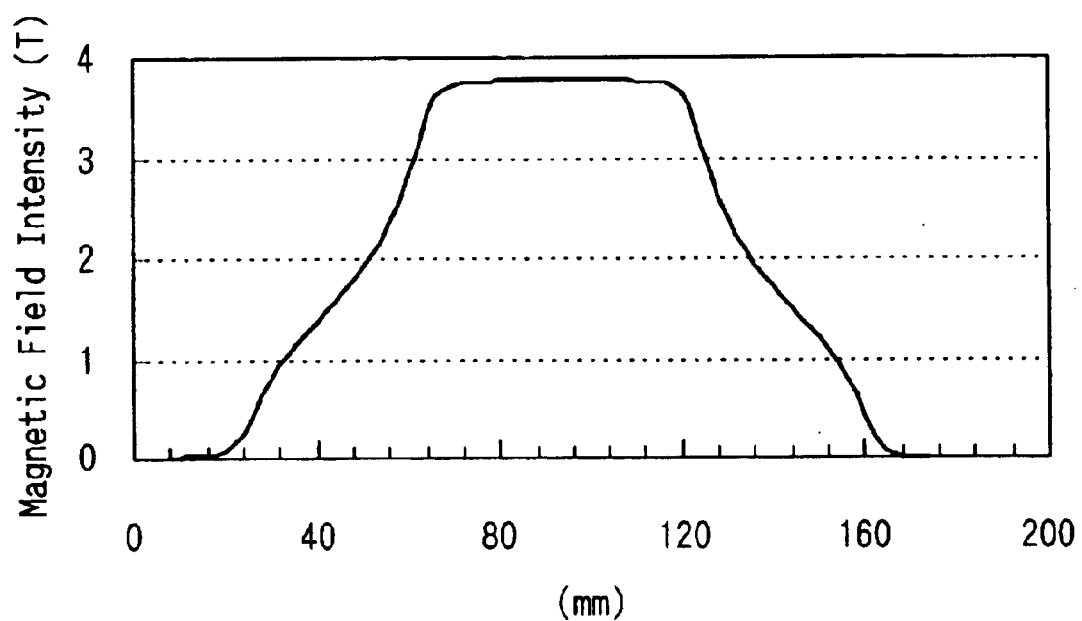
FIG. 7 is a graph showing a result of an experiment.

FIG. 7 shows magnetic field intensity in the magnetic field generation space 12 of the magnetic field generator 10. In this measurement, the magnetic field generator 10 had a diameter of approximately 240 mm and a length of approximately 170 mm, with the magnetic field generation space 12 having a diameter of approximately 6 mm.

In FIG. 7, the horizontal axis represents the distance from a longitudinal end of the magnetic field generation space 12, whereas the vertical axis represents the magnetic field intensity.

According to the magnetic field generator 10, as is clear from FIG. 7, it is possible to generate a strong magnetic field as high as approximately 3.8 T at room temperatures in a center portion of the magnetic field generation space 12 where the first magnetic circuit 14 and the second magnetic circuit 16 are formed.

It should be noted here that the pole pieces 24a and 24b may not necessarily be made of Permendule, but may be of another magnetic material having a high saturation magnetism represented by pure iron for example.

The present invention being thus far described and illustrated in detail, it is obvious that these description and drawings only represent an example of the present invention, and should not be interpreted as limiting the invention. The spirit and scope of the present invention is only limited by words used in the accompanied claims.

What is claimed is:

1. A magnetic field generator comprising:
    a first magnetic circuit including first permanent magnets disposed annularly; and
    a second magnetic circuit including a pair of pole pieces provided inside the first magnetic circuit, and second permanent magnets for magnetic connection of the pole pieces, wherein the pole pieces are opposed to each other for formation of a magnetic field generation space, each of the pole pieces having a saturation magnetism not smaller than 1.6 T.

2. The magnetic field generator according to claim 1, wherein a direction of magnetization of each second permanent magnet is not a 180-degree angle with respect to a direction of magnetic field of the magnetic field generation space.

3. The magnetic field generator according to claim 1 or 2, wherein the second permanent magnets have a greater coercive force than the first permanent magnets.

4. The magnetic field generator according to claim 1 or 2, further comprising third permanent magnets disposed on both end sides of the first permanent magnets.

* * * * *

UNITED STATES PATENT AND TRADEMARK OFFICE
CERTIFICATE OF CORRECTION

PATENT NO.         : 6,768,407 B2
APPLICATION NO. : 10/471295
DATED              : July 27, 2004
INVENTOR(S)        : Tsutomu Kohda and Masayuki Kumada It is certified that error appears in the above-identified patent and that said Letters Patent is hereby corrected as shown below:

Title page item [73], the Assignees, so as to read as follows:

-- NEOMAX Co., Ltd. Osaka (JP); and
National Institute of Radiological Sciences, Chiba (JP). --

Signed and Sealed this

Seventeenth Day of February, 2009

JOHN DOLL
*Acting Director of the United States Patent and Trademark Office*